United States Patent
Hirata et al.

(10) Patent No.: US 11,267,722 B2
(45) Date of Patent: Mar. 8, 2022

(54) OXIDE SUPERCONDUCTING WIRE AND METHOD OF MANUFACTURING THE SAME

(71) Applicant: Fujikura Ltd., Tokyo (JP)

(72) Inventors: Wataru Hirata, Sakura (JP); Shinji Fujita, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 17/268,334

(22) PCT Filed: Dec. 9, 2019

(86) PCT No.: PCT/JP2019/048094
§ 371 (c)(1),
(2) Date: Feb. 12, 2021

(87) PCT Pub. No.: WO2020/137490
PCT Pub. Date: Jul. 2, 2020

(65) Prior Publication Data
US 2021/0323834 A1    Oct. 21, 2021

(30) Foreign Application Priority Data

Dec. 28, 2018    (JP) .................. JP2018-248245

(51) Int. Cl.
*C01G 3/00*    (2006.01)
*C04B 35/45*    (2006.01)
(Continued)

(52) U.S. Cl.
CPC .......... *C01G 3/006* (2013.01); *C04B 35/4504* (2013.01); *C23C 14/08* (2013.01);
(Continued)

(58) Field of Classification Search
CPC ..... C01G 3/006; C04B 35/4504; C23C 14/08; H01B 12/06; H01B 13/00; C01P 2002/50;
(Continued)

(56) References Cited

U.S. PATENT DOCUMENTS

2010/0144536 A1* 6/2010 Obradors Berenguer ..................
B82Y 30/00
505/126

FOREIGN PATENT DOCUMENTS

| JP | 5736522 B2 | 6/2015 |
| WO | 2017/217487 A1 | 12/2017 |

OTHER PUBLICATIONS

International Search Report issued in corresponding International Application No. PCT/JP2019/048094 dated Feb. 25, 2020, (3 pages).
(Continued)

*Primary Examiner* — Paul A Wartalowicz
(74) *Attorney, Agent, or Firm* — Osha Bergman Watanabe & Burton LLP (57) ABSTRACT

An oxide superconducting wire includes a superconducting layer deposited on a substrate. The superconducting layer includes an oxide superconductor RE-Ba—Cu—O and artificial pinning centers $ABO_3$, where RE is a rare earth element, A is Ba, Sr or Ca, and B is Hf, Zr, or Sn. In a TEM image of a cross-section of the superconducting layer, a standard deviation σ of an inclination angle of the artificial pinning center rods with respect to a cross-sectional direction of the superconducting layer is 6.13° to 11.73° and an average length of the artificial pinning center rods is 19.84 to 25.44 nm.

9 Claims, 5 Drawing Sheets (51) Int. Cl.
*C23C 14/08* (2006.01)
*H01B 12/06* (2006.01)
*H01B 13/00* (2006.01)

(52) U.S. Cl.
CPC .............. *H01B 12/06* (2013.01); *H01B 13/00* (2013.01); *C01P 2002/50* (2013.01); *C01P 2002/74* (2013.01); *C01P 2004/04* (2013.01); *C01P 2006/40* (2013.01)

(58) Field of Classification Search
CPC .............. C01P 2002/74; C01P 2006/40; C01P 2004/04
See application file for complete search history.

(56) References Cited

OTHER PUBLICATIONS

Yoshida, Tomo et al., "Yttrium-based Coated Conductors With Artifitial Pinning Centers", Fujikura Technical Review, 2017, vol. 1, No. 130 (14 pages).
Ichinose, Ataru et al., "Improvement of Jc properties through Control of Nanorod Morphology,—Formation of High-density Nanorods by Controlling Growth Conditions-", Teion Kogaku (J. Cryo. Super. Soc. Jpn.) vol. 48, No. 9 (2013) (8 pages).
B. Maiorov et al., Synergetic combination of different types of defect to optimize pinning landscape using BaZrO3-doped YBa2Cu3O7, <Nature Materials>, vol. 8, pp. 398-404, Apr. 6, 2009 (7 pages).
Y. Zhang et al., Magnetic field orientation dependence of flux pinning in (Gd,Y)Ba2Cu3O7-x coated conductor with tilted lattice and nanostructures, <Physica C>, vol. 469, pp. 2044-2051, Aug. 25, 2009 (8 pages).
T. Maeda et al., Nanostructural characterization of artifical pinning centers in PLD-processed REBa2Cu3O7-d films, <Ultramicroscopy>, vol. 176, pp. 151-160, Nov. 22, 2016 (10 pages).

* cited by examiner

OXIDE SUPERCONDUCTING WIRE AND METHOD OF MANUFACTURING THE SAME

The present application claims priority from International Patent Application No. PCT/2019/048094 filed Dec. 9, 2019, which claims priority from Japanese Patent Application No. 2018-248245 filed Dec. 28, 2018. The content of both applications are incorporated herein in their entirety.

TECHNICAL FIELD

The present invention relates to an oxide superconducting wire and a method of manufacturing the same.

BACKGROUND

As a structure of a superconducting wire using an RE-Ba—Cu—O oxide superconductor such as $REBa_2Cu_3Ox$ (RE is a rare earth element), a structure in which an oxide superconducting layer is formed on a substrate such as a metal tape via an intermediate layer is employed. Particularly in recent years, in order to improve the critical current value in a magnetic field, an artificial pinning center material has been introduced into a superconducting layer (see Patent Document 1 and Non-Patent Document 1).

PATENT DOCUMENT

[Patent Document 1] Japanese Patent No. 5736522

NON-PATENT DOCUMENT

[Non-Patent Document 1] Tomo Yoshida, et al., "Yttrium-based Coated Conductors With Artificial Pinning Centers", Fujikura Technical Review, No. 47 November, 2017, pp. 19-25

As a method of increasing the critical current value in the magnetic field of a superconducting wire, there is a method of adding artificial pinning centers to the superconducting layer. In the case of the method of adding artificial pinning centers to the superconducting layer, the artificial pin becomes a pinning center by growing the artificial pin in a rod shape, and thereby, the superconducting characteristic in a magnetic field can be enhanced. On the other hand, if the deposition rate is increased in an attempt to increase the film thickness deposited per unit time in order to improve productivity, the crystallinity of the superconductor may be disturbed and the critical current value may decrease.

SUMMARY

One or more embodiments of the present invention provide an oxide superconducting wire and a method of manufacturing the same where in an oxide superconducting wire having a superconducting layer in which artificial pinning centers are introduced, both an increase in a critical current value and an improvement in productivity by increasing a deposition rate are obtained.

The first aspect of the present invention is an oxide superconducting wire including a superconducting layer deposited on a substrate, and the superconducting layer includes an RE-Ba—Cu—O-based oxide superconductor and artificial pinning centers comprising $ABO_3$, where RE represents a rare earth element, A represents Ba, Sr or Ca, and B represents Hf, Zr, or Sn, and in a cross-sectional TEM image of the superconducting layer, a standard deviation $\sigma$ of an inclination angle of the artificial pinning centers with respect to a thickness direction of the superconducting layer is in a range of 6.13° to 11.73° (inclusive) and an average length of the artificial pinning centers is in a range of 19.84 to 25.44 nm (inclusive).

In the second aspect of the present invention, in the oxide superconducting wire of the first aspect, the number density of the artificial pinning centers in a plane perpendicular to the thickness direction of the superconducting layer may be 1000 to 3500 pieces/$\mu m^2$. In the third aspect of the present invention, in the oxide superconducting wire of the first or second aspect, a ratio of a-axis oriented grains of the RE-Ba—Cu—O-based oxide superconductor calculated by the X-ray intensity ratio may be 10% or less. In the fourth aspect of the present invention, in the oxide superconducting wire of any of the first to third aspects, the critical current density Jc at a temperature of 30K and a magnetic field of 2 T may be 6.0 MA/$cm^2$ or more.

The fifth aspect of the present invention is a method of manufacturing an oxide superconducting wire having a critical current density Jc of 6.0 MA/$cm^2$ or more in a magnetic field of 2 T in a c-axis direction at a temperature of 30K and comprising a superconducting layer deposited on a substrate, the method including a step of depositing the superconducting layer by a pulsed laser deposition method that comprises an RE-Ba—Cu—O based oxide superconductor where RE represents a rare earth element and artificial pinning centers comprising $AB_3$ where A represents Ba, Sr or Ca, and B represents Hf, Zr or Sn, and a deposition rate of the superconducting layer is 23 nm/sec or more.

In the sixth aspect of the present invention, in the method of manufacturing an oxide superconducting wire of the fifth aspect, a deposition rate of the superconducting layer may be 36 nm/sec or more.

In the seventh aspect of the present invention, in the method of manufacturing an oxide superconducting wire of the sixth aspect, the deposition rate of the superconducting layer may be 36 to 70 nm/sec.

In the eighth aspect of the present invention, in the method of manufacturing an oxide superconducting wire of the seventh aspect, the deposition rate of the superconducting layer may be 46 to 70 nm/sec.

In the ninth aspect of the present invention, in the method of manufacturing an oxide superconducting wire of any one of the fifth to eighth aspects, the number density of the artificial pinning centers in a plane perpendicular to the thickness direction of the superconducting layer is 1000 to 3500 pieces/$\mu m^2$.

According to the aspects described above of the present invention, since the artificial pinning centers is included, it is possible to obtain both an increase in the critical current value and an improvement in productivity.

DETAILED DESCRIPTION

Hereinafter, one or more embodiments of the present invention will be described with reference to the drawings.

Figure 1:
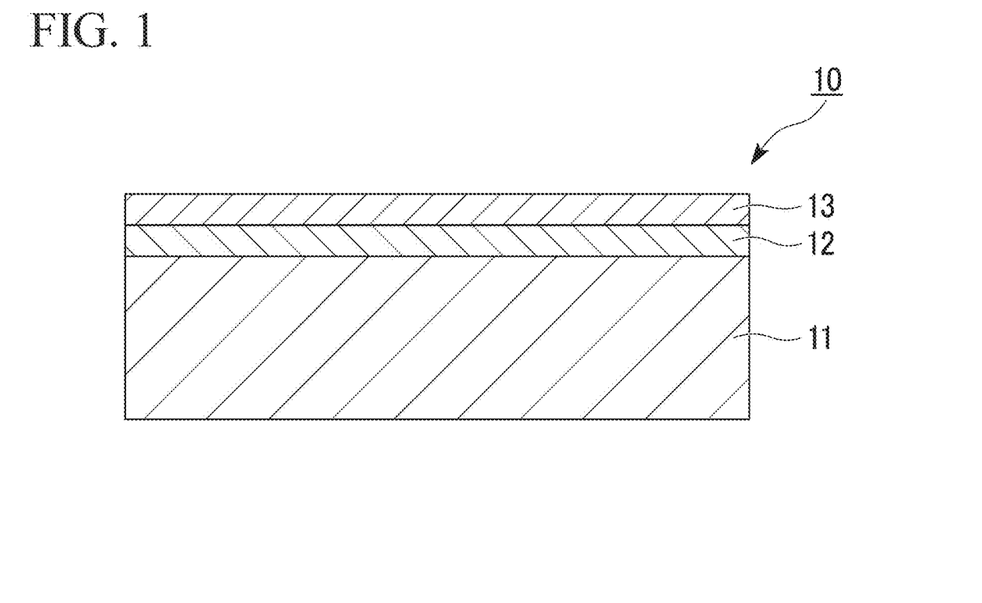
FIG. 1 is a cross-sectional view schematically showing an example of an oxide superconducting wire.

FIG. 1 shows an oxide superconducting wire of the present embodiment. The oxide superconducting wire material of one or more embodiments of the present embodiment is the oxide superconducting wire material 10 in which the superconducting layer 13 is deposited on the substrate 11. The surface of the substrate 11 may be provided with an intermediate layer 12 between the surface of the substrate 11 and the superconducting layer 13. The direction in which the substrate 11, the intermediate layer 12, and the superconducting layer 13 are deposited is the thickness direction. The width direction is a direction perpendicular to the longitudinal direction and the thickness direction.

The substrate 11 is a tape-shaped substrate (base material), and includes main surfaces (front surface and back surface opposing thereto) on both sides in the thickness direction. Specific examples of the metal constituting the substrate 11 include nickel alloys represented by Hastelloy (registered trademark), stainless steel, and oriented Ni—W alloys in which a texture is introduced into the nickel alloy. The thickness of the substrate 11 may be appropriately adjusted as needed, and is, for example, in the range of 10 to 500 μm. A metal thin film such as Ag or Cu may be formed on the back surface, the side surface, or both of the surfaces of the substrate 11 by sputtering or the like in order to improve the bondability.

Examples of the superconducting layer 13 include an RE-Ba—Cu—O-based oxide superconductor represented by the general formula of $REBa_2Cu_3Ox$. Examples of the rare earth element RE include one or more of Sc, Y, La, Ce, Pr, Nd, Pm, Sm, Eu, Gd, Tb, Dy, Ho, Er, Tm, Yb, and Lu. The thickness of the superconducting layer 13 is, for example, approximately 0.5 to 5 μm. The method of depositing the superconducting layer 13 includes a sputtering method, a vacuum vapor deposition method, a laser vapor deposition method, an electron beam vapor deposition method, a pulsed laser deposition method (PLD method), a chemical vapor deposition method (CVD method), an organic metal coating thermal decomposition method (MOD method) or the like. Above all, the superconducting layers 13 may be stacked by the PLD method.

The superconducting layer 13 includes artificial pinning centers represented by $ABO_3$ (A represents Ba, Sr or Ca, and B represents Hf. Zr or Sn). Specific examples of the material (artificial pinning center material) constituting the artificial pinning centers include at least one kind of such as $BaHfO_3$, $SrHfO_3$, $CaHfO_3$, $BaZrO_3$, and $BaSnO_3$, a solid solution thereof, or a mixture of two or more kinds thereof. The artificial pinning centers may have a rod shape having a length larger than the diameter of the artificial pinning centers. The length of the artificial pinning centers may be in the range of 15 to 30 nm on average. Specific examples of the average length of the artificial pinning centers include the range of 19.84 to 25.44 nm. The diameter of the artificial pinning centers may be 3 to 5 nm on average, or 4 to 5 nm on average. When a superconductor including artificial pinning centers is deposited in a direction perpendicular to the substrate 11 by the vapor phase method, the superconducting layer tends to have a c-axis perpendicular to the substrate surface. In this case, the artificial pinning center rods tend to grow in the c-axis direction of the superconductor or in a direction slightly inclined from the c-axis direction.

When the growth direction of the artificial pinning center rods (longitudinal direction of the rod) is aligned in the c-axis direction, a particularly strong pinning force is exhibited when a magnetic field is applied in the c-axis direction, however, there is an issue of anisotropy in which the magnetic field does not contribute much to pinning at other angles. Therefore, the longitudinal direction of the artificial pinning center rods may be inclined from the c-axis of the superconductor. When the longitudinal direction of the artificial pinning center rods is inclined from the c-axis of the superconductor, the angle of the superconductor with respect to the a-axis or the b-axis can be random. Therefore, the artificial pinning center rods directing different longitudinal directions contribute as pinning centers for magnetic fields of various angles, and the issue of anisotropy is improved. For example, the standard deviation σ of the inclination angle (tilt) of the artificial pinning center rods with respect to the thickness direction of the superconducting layer 13 is in the range of 5° to 20°. Specific examples of the standard deviation σ of the inclination angle include the range of 6.13° to 11.73°.

The number density of artificial pinning center rods in the plane perpendicular to the thickness direction of the superconducting layer 13 is in the range of 1000 to 3500 pieces/$μm^2$. If the number density of artificial pinning center rods is low, the effect of artificial pinning centers may be reduced.

The ratio of a-axis oriented grains of the RE-Ba—Cu—O-based oxide superconductor calculated by the X-ray intensity ratio may be within a predetermined range. Specifically, the ratio of a-axis oriented grains may be 10% or less. Here, the ratio of the a-axis oriented grains is a value calculated by the peak intensity ratio of the (006) peak and the (200) peak observed by the X-ray diffraction measurement by the 0-20 method, that is, [(200) peak intensity/((006) peak intensity]×100(%). When the proportion of a-axis oriented grains is small, it is possible to reduce a decrease in the crystallinity and critical current of the superconductor due to the abnormally oriented grains.

The oxide superconducting wire of one or more embodiments has a critical current density Jc of 6.0 $MA/cm^2$ or more at a temperature of 30K and a magnetic field of 2 T. As a result, a high critical current can be obtained.

The method of manufacturing the oxide superconducting wire of one or more embodiments includes a step of depositing a superconducting layer including the above-described oxide superconductor and artificial pinning centers by a pulsed laser deposition method (PLD method). Examples of a method of depositing a superconducting layer including an oxide superconductor and artificial pinning centers can be a method using a mixed target including a superconducting material and an artificial pinning center material and a method using two types of targets which are a first target including a superconducting material and a second target including artificial pinning center material. Two or more types of targets including a superconducting material and artificial pinning center material may be used. The first target including the superconducting material may include artificial pinning center material having a lower concentration than the superconducting material, or may substantially not include the artificial pinning center material. The second target including the artificial pinning center material may include a superconducting material having a lower concentration than the artificial pinning center material, or may substantially not include the superconducting material. When two or more types of targets having different compositions are used, the targets may be arranged side by side and integrated, or the targets may be arranged at different positions in the space for forming the superconducting layer (deposition space). The concentration of the artificial pinning centers with respect to the superconducting material in the target is, for example, 0.5 to 10 mol %. The concentration of the artificial pinning center material in the target can be adjusted in accordance with the concentration of the artificial pinning centers (molar concentration or number concentration) with respect to the superconducting layer. The superconducting layer 13 may include impurities such as $RE_2O_3$ derived from the superconducting material of the target.

In the manufacturing method of one or more embodiments, the deposition rate of the superconducting layer 13 including artificial pinning centers may be increased. The deposition rate of the superconducting layer 13 may be, for example, 23 nm/sec or more, or 36 nm/sec or more. In addition, the deposition rate may be 36 to 70 nm/sec, particularly 46 to 70 nm/sec. By increasing the deposition rate, it is possible to suppress the artificial pinning center rods from growing linearly along the depositing direction (c-axis direction), and the artificial pinning center rods are likely to grow in a direction inclined from the c-axis direction. Therefore, the dependence of magnetic field angle of the critical current is reduced. In addition, since the film formation space is less susceptible to temperature variations, even if artificial pinning center material is added to the superconducting material, the growth of a-axis oriented grains is suppressed, and the c-axis oriented film can be preferentially grown. Furthermore, the productivity can be improved by increasing the deposition rate of the superconducting layer 13.

From the viewpoint of orientation control of the superconducting layer 13, the intermediate layer 12 may be disposed on the surface of the substrate 11 including a metal and to form the superconducting layer 13 on the intermediate layer 12. The intermediate layer 12 may have a multi-layer structure, and may have a diffusion prevention layer, a bed layer, an alignment layer, a cap layer, and the like in the order from the substrate 11 side to the superconducting layer 13 side, for example. These layers are not always provided one by one, and some layers may be omitted, or two or more layers of the same type may be repeatedly deposited.

The diffusion prevention layer has a function of suppressing a portion of the components of the substrate 11 from diffusing and being mixed into the superconducting layer 13 as impurities. Examples of the material of the diffusion prevention layer include $Si_3N_4$, $Al_2O_3$, GZO ($Gd_2Zr_2O_7$) and the like. The thickness of the diffusion prevention layer is, for example, 10 to 400 nm.

The bed layer is used to reduce the reaction at an interface between the substrate 11 and the superconducting layer 13 and to improve the orientation of the layer formed on the bed layer. Examples of the material of the bed layer include $Y_2O_3$, $Er_2O_3$, $CeO_2$, $Dy_2O_3$, $Eu_2O_3$, $Ho_2O_3$, $La_2O_3$, and the like. The thickness of the bed layer is, for example, 10 to 100 nm.

The alignment layer is formed from a biaxially oriented material to control the crystal orientation of the cap layer thereon. Examples of the material of the alignment layer include metal oxides such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$. The orientation layer is formed by an ion-beam-assisted deposition (IBAD) method.

The cap layer has a material that is formed on the surface of the above-mentioned alignment layer and allows crystal grains to self-orient in the in-plane direction. Examples of the material of the cap layer include $CeO_2$, $Y_2O_3$, $Al_2O_3$, $Gd_2O_3$, $ZrO_2$, YSZ, $Ho_2O_3$, $Nd_2O_3$, $LaMnO_3$, and the like. The thickness of the cap layer is in the range of 50 to 5000 nm.

A protective layer may form on the surface of the superconducting layer 13. The protective layer has functions such as bypassing an overcurrent generated at the time of an accident and suppressing a chemical reaction occurring between the superconducting layer 13 and a layer provided on the protective layer. Examples of the material of the protective layer include silver (Ag), copper (Cu), gold (Au), an alloy of gold and silver, other silver alloys, copper alloys, gold alloys, and the like. The protective layer covers at least the surface of the superconducting layer 13 (the surface opposite to the substrate 11 side in the thickness direction). In addition, the protective layer may cover a portion of or all of a region selected from the side surface of the superconducting layer 13, the side surface of the intermediate layer 12, the side surface of the substrate 11, and the back surface of the substrate 11.

The superconducting wire 10 may have a stabilization layer around the laminate body including the substrate 11 and the superconducting layer 13. Examples of the region where the stabilization layer is formed include the back surface of the substrate 11, the front surface of the superconducting layer 13, and the side surface of the substrate 11 or the superconducting layer 13. When the superconducting wire 10 includes a protective layer, a stabilization layer may be provided on the protective layer. The material used for the stabilization layer may differ depending on the application of the superconducting wire 10. For example, when used in a superconducting cable or a superconducting motor, a metal with good conductivity is used because the wire needs to function as the main portion of the bypass that commutates the overcurrent generated at the time of transition to the normal conducting state. Examples of the metal having good conductivity include metals such as copper, a copper alloy, aluminum, and an aluminum alloy. In addition, when used in a superconducting current limiter, a high resistance metal is used because it is necessary to instantly suppress the overcurrent generated at the time of transition to the normal conduction state. Examples of the metals having high resistance include Ni-based alloys such as NiCr.

Although the present invention has been described above based on one or more embodiments, the present invention is not limited to the above-described embodiments, and various modifications can be made without departing from the gist of the present invention.

The superconducting wire 10 can be used in various forms such as a tape shape, a cable shape, and a coil shape. In order to manufacture a superconducting coil using the superconducting wire 10, the superconducting wire 10 is wound along the outer peripheral surface of the winding frame in the required number of layers to form a coil shape (multi-layer winding coil), and then the superconducting wire 10 can be fixed by impregnating a resin such as an epoxy resin so as to cover the wound superconducting wire 10. Furthermore, the superconducting wire member 10 can include an external terminal. The portion having the external terminal may have a cross-sectional structure different from that of the other portion.

Hereinafter, the present invention will be specifically described with reference to Examples.

An intermediate layer was formed on a tape-shaped substrate having Hastelloy (registered trademark) by using an ion beam sputtering method or the like. Using an $EuBa_2Cu_3Ox$ target to which $BaHfO_3$ was added as artificial pinning center material, a superconducting layer was formed by the PLD method to manufacture a superconducting wire. Each superconducting wire was prototyped by changing the amount of $BaHfO_3$ added to the target and the deposition rate.

The deposition rate can be appropriately set by, for example, adjusting the pulse frequency [Hz] of the laser of the PLD apparatus and the ambient pressure [Pa] at the time of film formation by the PLD.

The pulse frequency of the laser can be adjusted, for example, in the range of 10 to 1000 Hz. Increasing the pulse frequency of the laser tends to increase the standard deviation of the inclination angle of the artificial pinning center rods and decrease the average length of the artificial pinning center rods.

The film formation by the PLD was performed with oxygen gas flowing into the film formation chamber. In particular, the film formation by the PLD was performed while maintaining a constant ambient pressure by inflowing oxygen gas after depressurizing the film formation chamber using a vacuum pump and adjusting the inflow amount of oxygen gas. The ambient pressure at the time of the film formation can be adjusted in the range of, for example, 1 to 1000 Pa. By increasing the ambient pressure during the film formation by the PLD, the standard deviation of the inclination angle of the artificial pinning center rods tended to increase, and the average value of the lengths of the artificial pinning center rods tended to decrease.

Figure 2:
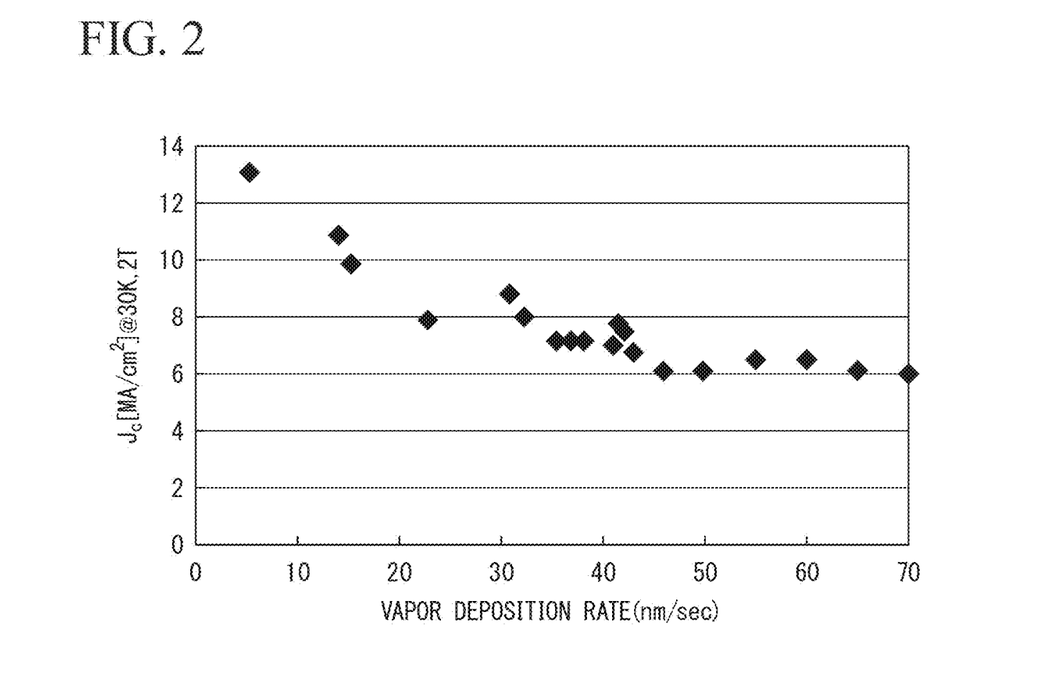
FIG. 2 is a graph showing an example of the relationship between a deposition rate and a critical current density.

The critical current value of the prototype superconducting wire in a magnetic field in the c-axis direction was measured by the four-probe method. The measurement conditions for the critical current value were a temperature of 30K and a magnetic field of 2 T. From the critical current value of the superconducting wire and the cross-sectional area of the superconducting layer, the critical current density Jc at a temperature of the superconducting layer of 30K and a magnetic field of 2 T was calculated. FIG. 2 shows an example of the relationship between the deposition rate of the superconducting layer and the critical current density Jc. In the region where the deposition rate was low, which is less than 23 nm/sec, the critical current density tended to decrease monotonically as the deposition rate increased. In the range where the deposition rate was 23 nm/sec or more (particularly, 23 to 70 nm/sec, 36 to 70 nm/sec, or 46 to 70 nm/sec), even when the deposition rate was changed so as to increase, it was found that the value of the critical current density was almost constant while maintaining 6.0 MA/cm$^2$ or more, which is a guideline for a suitable critical current density.

Specifically, it was found that in the region where the deposition rate was less than 23 nm/sec, the value of the critical current density sharply decreased as the deposition rate increased. In this region, the artificial pinning center rods introduced into the superconducting layer grew along the c-axis direction and tended to have a uniform shape, and it is considered that the critical current density increased due to the pinning effect. However, the productivity was low due to the slow deposition rate. When the deposition rate was in the range of 23 to 70 nm/sec. it was considered that the orientation and shape of the artificial pinning center rods introduced into the superconducting layer were not excessively disturbed and were appropriately aligned, and high productivity could be realized while maintaining the critical current density at 6.0 MA/cm$^2$ or more. In the present embodiment, the superconducting wire could not be prototyped and evaluated in a region where the deposition rate was higher than 70 nm/sec due to the specifications of the used PLD apparatus. However, when the deposition rate was too high, it was considered that the orientation and shape of the artificial pinning center rods to be introduced into the superconducting layer were not aligned and the state thereof was excessively disturbed, and the critical current density was expected to gradually decrease.

From the relationship between the deposition rate of the superconducting layer and the critical current density Jc shown in FIG. 2 and Table 1 described later, when the deposition rate was 23 nm/sec or more and further, the critical current density Jc was in the range of 23 to 70 nm/sec, the critical current density Jc was 6.0 MA/cm$^2$ or more, and the critical current density Jc and productivity could be compatible at a high level. When the deposition rate was 36 nm/sec or more, and further, in the range of 36 to 70 nm/sec, the deposition rate was high and the critical current density Jc was 6.0 MA/cm$^2$ or more, and the critical current density Jc and productivity could be compatible at a high level. In addition, in the range of the deposition rate of 46 to 70 nm/sec, the deposition rate was higher and the critical current density Jc was 6.0 MA/cm$^2$ or more, and the critical current density Jc and the productivity could be compatible at a higher level.

Figure 3:
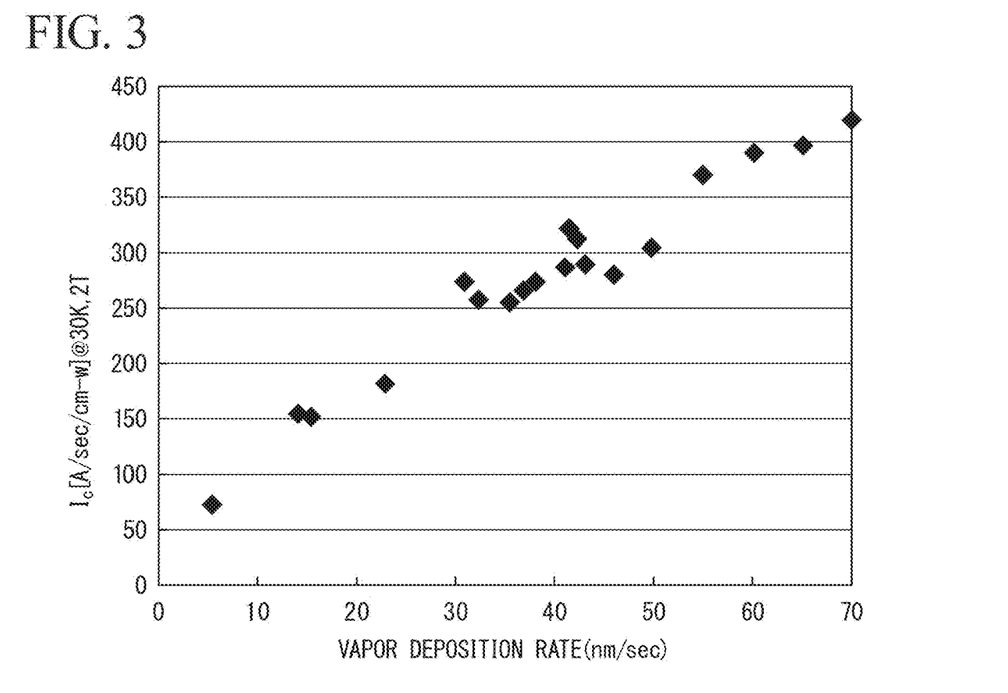
FIG. 3 is a graph showing an example of the relationship between a deposition rate and a critical current.

FIG. 3 shows an example of the relationship between the deposition rate and the critical current Ic. The vertical axis of FIG. 3 shows the critical current obtained per unit film-formation time (see) and unit width (cm-w) by taking the product of the critical current density Jc and the deposition rate. The higher the deposition rate, the greater the film thickness formed in the same film-formation time. As shown in FIG. 3, since the critical current value obtained per unit film-formation time increased almost in proportion to the increase in the deposition rate, it is possible to obtain both an increase in the critical current value and an improvement in productivity. In particular, even if the deposition rate was changed in the range of 31 to 50 nm/sec, it was found that the critical current value was almost constant in the range of 256.1 to 322.4 A/sec/cm-w. In addition, even if the deposition rate was changed in the range of 41 to 50 nm/sec, it was found that the critical current value was almost constant in the range of 280.5 to 322.4 A/sec/cm-w. When the deposition rate exceeded 55 nm/sec, the critical current value increased as the deposition rate increased Table 1 shows the values of the critical current density Jc and the critical current Ic corresponding to the graphs of FIGS. 2 and 3.

TABLE 1

| Deposition Rate [nm/sec] | Jc [MA/cm$^2$] | Ic [A/sec/cm-w] |
|---|---|---|
| 5 | 13.1 | 71.1 |
| 14 | 10.9 | 154.2 |
| 15 | 9.9 | 152.1 |
| 23 | 7.8 | 179.7 |
| 31 | 8.8 | 273.4 |

TABLE 1-continued

| Deposition Rate [nm/sec] | Jc [MA/cm$^2$] | Ic [A/sec/cm-w] |
|---|---|---|
| 32 | 8.0 | 257.8 |
| 36 | 7.2 | 256.1 |
| 37 | 7.2 | 265.9 |
| 38 | 7.2 | 273.6 |
| 41 | 7.0 | 287.4 |
| 42 | 7.7 | 322.4 |
| 42 | 7.4 | 313.8 |
| 43 | 6.8 | 292.4 |
| 46 | 6.1 | 280.5 |
| 50 | 6.1 | 305.0 |
| 55 | 6.5 | 355.6 |
| 60 | 6.5 | 388.7 |
| 65 | 6.2 | 403.0 |
| 70 | 6.0 | 420.0 |

Figure 4:
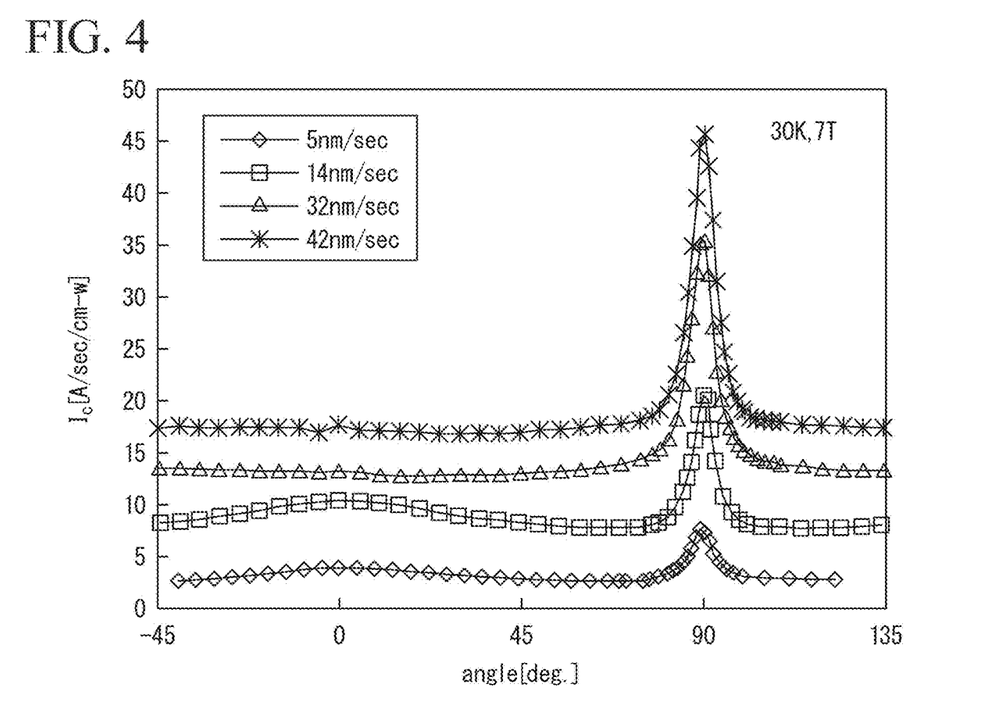
FIG. 4 is a graph showing an example of the relationship between a direction of a magnetic field and a critical current.

FIG. 4 shows an example of the dependence of the magnetic field angle (relationship with the direction of the magnetic field) of the critical current value obtained per unit of film formation time. The critical current value was measured under the conditions of a temperature of 30K and a magnetic field of 7 T. A horizontal-axis angle (deg.) was 0° when the angle of the magnetic field was perpendicular to the substrate, and was 90° when the angle of the magnetic field was parallel to the substrate. In each sample, a peak in which the critical current value increased was observed in the vicinity of an angle of 90°, and in a region where the deposition rate was low, a peak due to a linear artificial pinning center rods was observed in the vicinity of an angle of 0°. However, when the deposition rate was low, the critical current value tended to be low as a whole. On the other hand, in the region where the deposition rate was high, in addition to showing a high critical current value as a whole, it was found that the anisotropy decreased in the range of −45° to +45° and the flat dependence of the magnetic field angle was shown.

Figure 5:
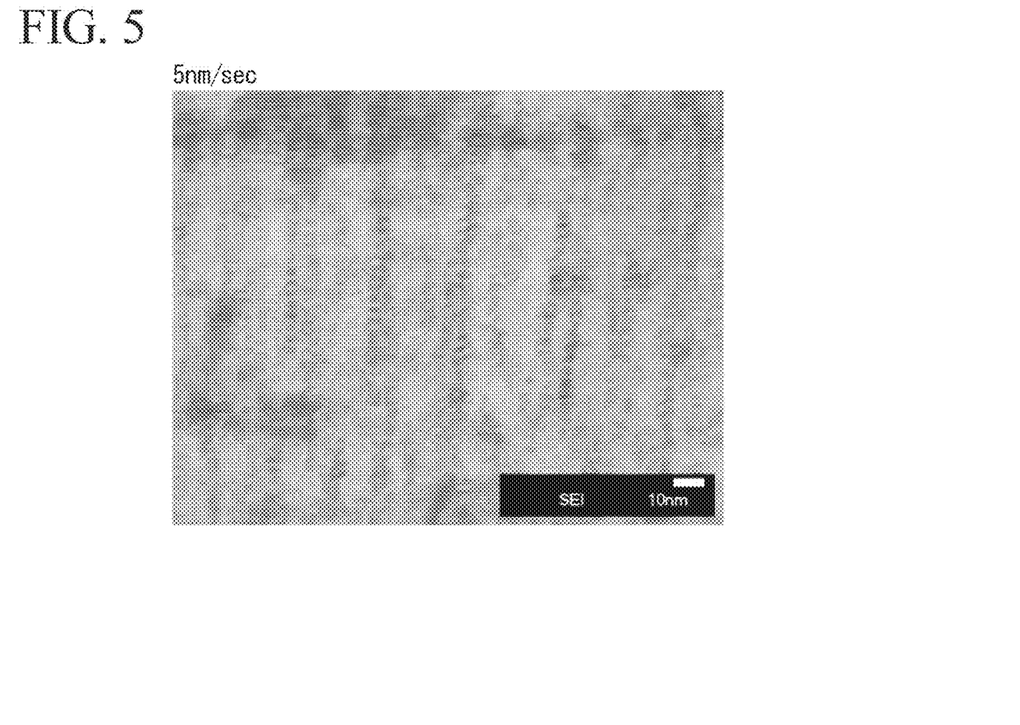
FIG. 5 is an image which captures an example of the superconducting layer at a deposition rate of 5 nm/sec.
Figure 6:
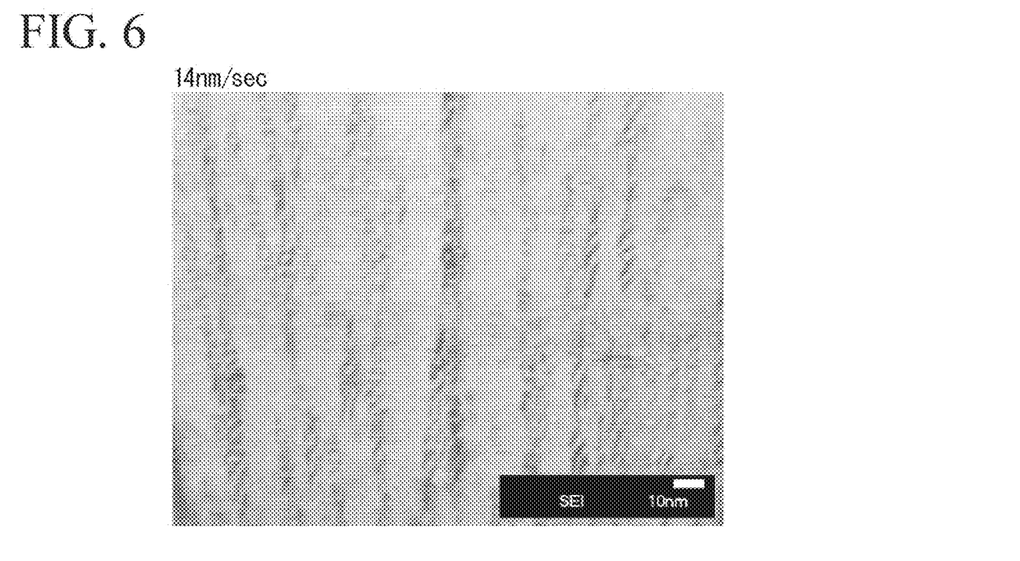
FIG. 6 is an image which captures an example of the superconducting layer at a deposition rate of 14 nm/sec.
Figure 7:
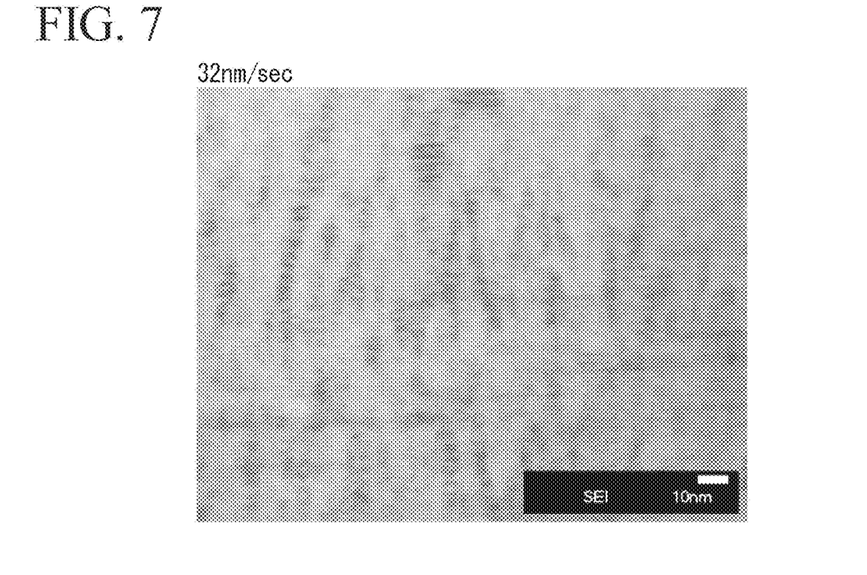
FIG. 7 is an image which captures an example of the superconducting layer at a deposition rate of 32 nm/sec.

In order to consider the difference in the dependence of the magnetic field angle of the critical current, a cross-sectional observation was performed using a transmission electron microscope (TEM) for a sample of the superconducting layer film-formed at each deposition rate, and an example is shown in FIG. 5 (deposition rate of 5 nm/sec), FIG. 6 (deposition rate of 14 nm/sec), and FIG. 7 (deposition rate of 32 nm/sec). These cross-sectional TEM images are captured images of cross-sections parallel to the thickness direction of the superconducting layer. The artificial pinning center rods confirmed by observation of the cross-sectional structure showed a tendency to grow linearly along the c-axis crystal direction of the superconductor when the deposition rate was low. On the other hand, when the deposition rate was high, the growth direction of the artificial pinning center rods was inclined from the c-axis crystal direction, showing a tendency to grow in a random direction. It was found that this contributed to the flat dependence of the magnetic field angle.

Generally, by introducing artificial pinning centers into the superconducting layer, the effect of increasing the critical current value in a magnetic field can be obtained. However, on the other hand, it is known that the magnetic field dependence of the macroscopic pinning force density of the superconducting layer changes depending on temperature. Such a phenomenon in which the magnetic field dependence of the macroscopic pinning force density changes depending on temperature can be suppressed by adjusting the deposition rate of the superconducting layer as in the present invention.

Figure 8:
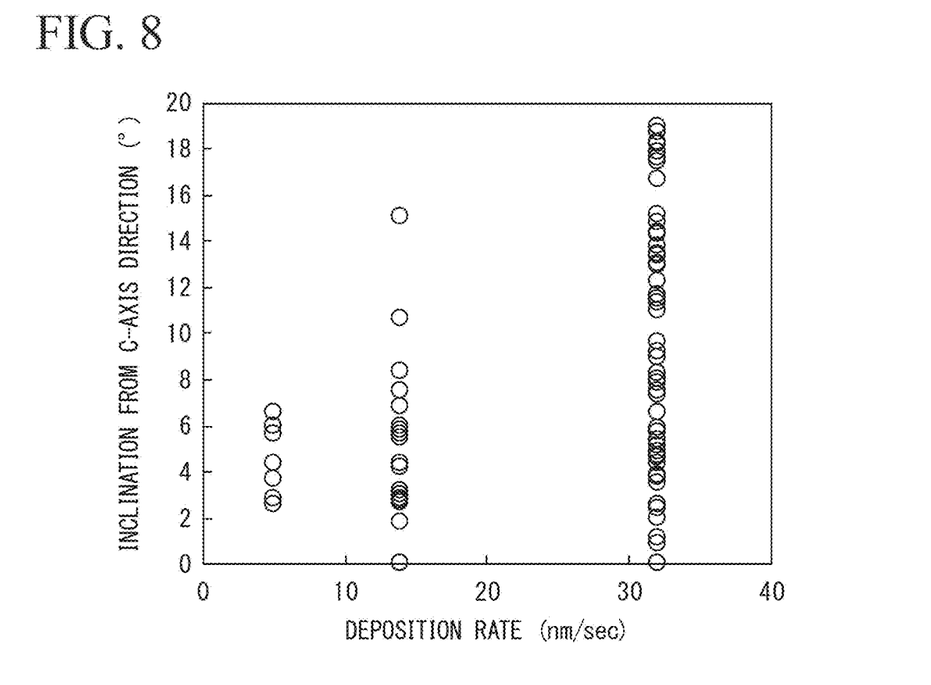
FIG. 8 is a graph showing an example of the relationship between a deposition rate and an inclination angle of artificial pinning center rods.
Figure 9:
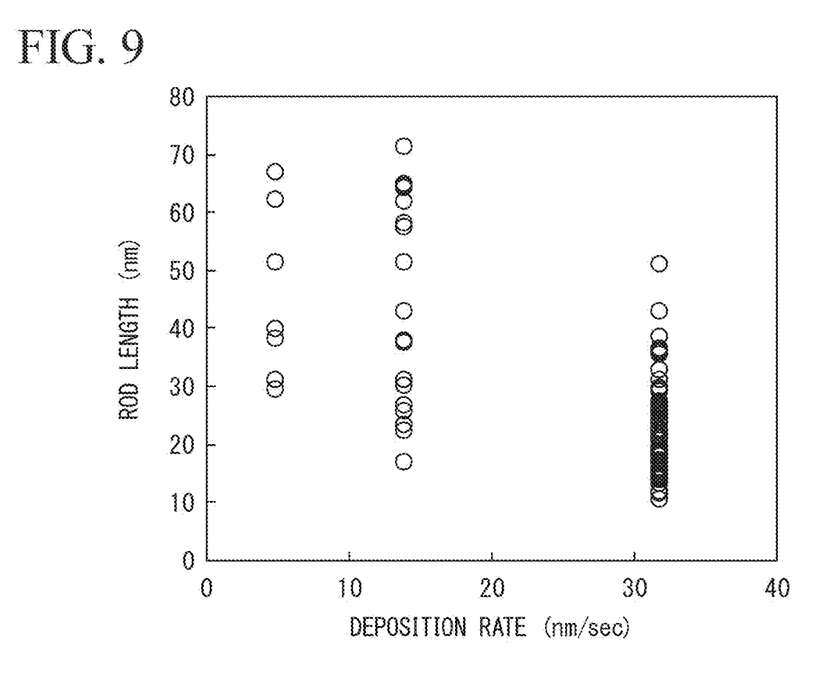
FIG. 9 is a graph showing an example of the relationship between a deposition rate and length of artificial pinning center rods.

The cross sections parallel to the thickness direction of the superconducting layers of Sample Nos. 1 to 6 were observed with a transmission electron microscope (TEM), and the inclination angle and length of the artificial pinning center rods that appeared in the superconducting layer in the region of 140 nm×170 nm were measured. The inclination angle is an inclination angle of the artificial pinning center rods with respect to the thickness direction of the superconducting layer. The length is a length of the artificial pinning center rods along the cross section. In the case where the length direction of the artificial pinning center rods did not follow the cross section, such as when the length was less than the thickness, the case was excluded from the measurement targets of the inclination angle and the length. FIG. 8 shows an example of the relationship between the deposition rate and the inclination angle (inclination from the c-axis direction) of the artificial pinning center rods. FIG. 9 shows an example of the relationship between the deposition rate and the length of the artificial pinning center rods (rod length). In these graphs, the results of Samples 3 to 6 with the same deposition rate of 32 nm/sec are shown together. Table 2 shows the minimum value, maximum value, average value, and standard deviation of the inclination angle of the artificial pinning center rods measured for each sample. Table 3 shows the minimum value, maximum value, average value, and standard deviation of the length of the artificial pinning center rods.

TABLE 2

| Sample No. | Deposition Rate [nm/sec] | Number of Data | Inclination Angle of Artificial Pinning Center Rods [°] | | | |
|---|---|---|---|---|---|---|
| | | | Minimum Value | Maximum Value | Average Value | Standard Deviation |
| 1 | 5 | 10 | 2.6 | 6.6 | 4.67 | 1.65 |
| 2 | 14 | 28 | 0.0 | 15.0 | 4.15 | 3.59 |
| 3 | 32 | 24 | 0.0 | 18.7 | 8.66 | 6.13 |
| 4 | 32 | 19 | 2.54 | 35.47 | 11.70 | 9.14 |
| 5 | 32 | 19 | 0.00 | 75.7 | 11.59 | 7.29 |
| 6 | 37 | 23 | 0.00 | 37.5 | 15.95 | 11.73 |

TABLE 3

| Sample No. | Deposition Rate [nm/sec] | Number of Data | Length of Artificial Pinning Center Rods [nm] | | | |
|---|---|---|---|---|---|---|
| | | | Minimum Value | Maximum Value | Average Value | Standard Deviation |
| 1 | 5 | 10 | 29.2 | 66.7 | 45.54 | 14.96 |
| 2 | 14 | 28 | 16.7 | 71.2 | 41.03 | 15.59 |
| 3 | 32 | 24 | 13.9 | 50.9 | 21.14 | 8.25 |
| 4 | 32 | 19 | 13.7 | 42.9 | 25.44 | 8.19 |
| 5 | 32 | 19 | 11.4 | 35.9 | 19.84 | 7.02 |
| 6 | 32 | 23 | 10.3 | 36.0 | 21.69 | 6.71 |

Figure 10:
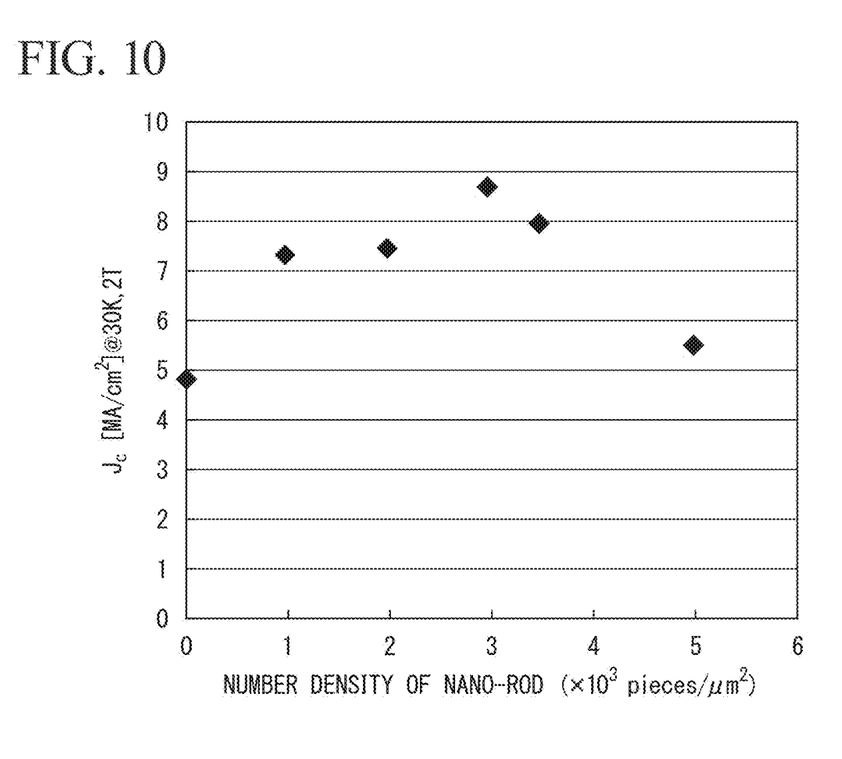
FIG. 10 is a graph showing an example of the relationship between the number density of artificial pinning center rods and critical current density.

FIG. 10 shows an example of the relationship between the number density of artificial pinning center rods and the critical current density. The number density of artificial pinning center rods is determined by counting the number of artificial pinning center rods within a predetermined range from the plan-view TEM image in the plane perpendicular to the thickness direction of the superconducting layer (ab plane perpendicular to c-axis), and dividing the number by the area corresponding to the range. FIG. 10 was created by measuring the number density of artificial pinning center rods of a sample in which a superconducting layer was formed at a deposition rate of about 40 nm/sec, and the critical current density at a temperature of 30K and a magnetic field of 2 T. It was found that the critical current density Jc was high when the number density was in the range of $1\times10^3$ to $3.5\times10^3$ pieces/μm². Critical current densities Jc may be 6.0 MA/cm² or more at a temperature of 30K and a magnetic field of 2 T.

In addition, when a plan-view TEM image of the superconducting layer formed at a deposition rate of 14 nm/sec or 40 nm/sec was captured in a range of approximately 20 to 30 nm in a side, it was found that in the deposition rate was 14 nm/sec and when the number density of the artificial pinning center rods was increased to approximately $5\times10^3$ pieces/μm², a-axis oriented grains were likely to be generated. When the deposition rate was 40 nm/sec, a-axis oriented grains were not observed in any of the number density of artificial pinning center rods of $1\times10^3$ pieces/μm², $2\times10^3$ pieces/μm², $3\times10^3$ pieces/μm², or $5\times10^3$ pieces/μm². The ratio of a-axis oriented grains can be calculated from the X-ray intensity ratio. As described above, in order to suppress the decrease in the critical current value, no a-axis oriented grains is observed.

Furthermore, although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF THE REFERENCE SYMBOLS

10: Oxide superconducting wire,
11: Substrate,
12: Intermediate layer,
13: Superconducting layer

The invention claimed is:

1. An oxide superconducting wire comprising:
a superconducting layer deposited on a substrate, wherein the superconducting layer comprises:
an oxide superconductor comprising RE—Ba—Cu—O; and
artificial pinning center rods comprising $ABO_3$, where
RE is a rare earth element,
A is Ba, Sr or Ca, and
B is Hf, Zr, or Sn, and
in a TEM image of a cross-section of the superconducting layer, a standard deviation n of an inclination angle of the artificial pinning center rods with respect to a cross-sectional direction of the superconducting layer is 6.13° to 11.73° and an average length of the artificial pinning center rods is 19.84 to 25.44 nm.

2. The oxide superconducting wire according to claim 1, wherein a number density of the artificial pinning center rods in a plane perpendicular to the cross-sectional direction of the superconducting layer is 1000 to 3500 pieces/μm².

3. The oxide superconducting wire according to claim 1, wherein a ratio of a-axis oriented grains of the oxide superconductor calculated by an X-ray intensity ratio is 10% or less.

4. The oxide superconducting wire according to claim 1, wherein a critical current density Jc at a temperature of 30K and a magnetic field of 2 T is 6.0 MA/cm² or more.

5. A method of manufacturing an oxide superconducting wire having a critical current density Jc of 6.0 MA/cm² or more in a magnetic field of 2 T in a c-axis direction at a temperature of 30K, the method comprising:
depositing, by a pulsed laser deposition method at a deposition rate of 23 nm/sec or more, a superconducting layer that comprises:
an oxide superconductor comprising RE—Ba—Cu—O; and
artificial pinning center rods comprising $ABO_3$, where
RE is a rare earth element,
A is Ba, Sr or Ca, and
B is Hf, Zr or Sn.

6. The method of manufacturing an oxide superconducting wire according to claim 5, wherein the deposition rate of the superconducting layer is 36 nm/sec or more.

7. The method of manufacturing an oxide superconducting wire according to claim 6, wherein the deposition rate of the superconducting layer is 36 to 70 nm/sec.

8. The method of manufacturing an oxide superconducting wire according to claim 7, wherein the deposition rate of the superconducting layer is 46 to 70 nm/sec.

9. The method of manufacturing an oxide superconducting wire according to claim 5, wherein a number density of the artificial pinning center rods in a plane perpendicular to the cross-sectional direction of the superconducting layer is 1000 to 3500 pieces/μm².

* * * * *